United States Patent [19]

Blanchard et al.

[11] Patent Number: 4,956,700
[45] Date of Patent: Sep. 11, 1990

[54] INTEGRATED CIRCUIT WITH HIGH POWER, VERTICAL OUTPUT TRANSISTOR CAPABILITY

[75] Inventors: Richard A. Blanchard, Los Altos; Richard K. Williams, Cupertino, both of Calif.

[73] Assignee: Siliconix Incorporated, Santa Clara, Calif.

[21] Appl. No.: 356,631

[22] Filed: May 22, 1989

Related U.S. Application Data

[63] Continuation of Ser. No. 85,792, Aug. 17, 1987, abandoned.

[51] Int. Cl.$^5$ .................................... H01L 29/78
[52] U.S. Cl. ............................ 357/23.4; 357/23.8; 357/23.12
[58] Field of Search ................. 357/23.4, 23.8, 13, 357/23.12; 557/23.4

[56] References Cited

U.S. PATENT DOCUMENTS

| | | | |
|---|---|---|---|
| 3,996,655 | 12/1976 | Cunningham et al. | 357/23.4 |
| 4,290,077 | 9/1981 | Rosen | 357/23.4 |
| 4,325,180 | 4/1982 | Curran | 357/23.4 |
| 4,376,286 | 3/1983 | Lidav et al. | 357/23.4 |
| 4,589,004 | 5/1986 | Yasuda | 357/23.8 |
| 4,614,959 | 9/1986 | Nakagawa | 357/23.8 |
| 4,661,838 | 4/1987 | Wildi et al. | 357/23.8 |
| 4,686,551 | 8/1987 | Mihara | 357/23.4 |

FOREIGN PATENT DOCUMENTS

| | | | |
|---|---|---|---|
| 57-141965 | 9/1982 | Japan | 357/23.4 |
| 58-6170 | 1/1983 | Japan | 357/23.4 |
| 58-42274 | 3/1983 | Japan | 357/23.4 |
| 60-107886 | 6/1985 | Japan | 357/23.4 |
| 8202981 | 9/1982 | PCT Int'l Appl. | 357/23.4 |

OTHER PUBLICATIONS

Grove, A., *Physics and Technology of Semiconductor Devices*, John Wiley, 1967, pp. 330–331.
Sze, S. M., *Semiconductor Devices*, John Wiley, 1985, pp. 422–423.

*Primary Examiner*—Edward J. Wojciechowicz
*Assistant Examiner*—Sara W. Crang
*Attorney, Agent, or Firm*—Flehr, Hohbach, Test, Albritton & Herbert

[57] ABSTRACT

A power transistor structure (10) is formed on an n+ substrate (12). A p— epitaxial layer (16) is formed on the substrate (12) and has an upper surface (19). An n+ source region (26) extends from the upper surface (19) into the epitaxial layer (16). An n-type drain region (22, 24) is spaced from the source region (26) and extends from the upper surface (19) through the epitaxial layer (16) to the substrate (12). An insulating layer (28) on the upper surface (19) extends between the source region (26) and the drain region (22, 24). A conductive gate electrode (34) on the insulating layer (28) extends between the source region (26) and the drain region (22, 24). A conductive electrode (30) is electrically connected to the source region (26). Another conductive electrode (36) is electrically connected to the substrate (12).

20 Claims, 5 Drawing Sheets

INTEGRATED CIRCUIT WITH HIGH POWER, VERTICAL OUTPUT TRANSISTOR CAPABILITY

This is a continuation, of application Ser. No. 085,792 filed Aug. 17, 1987, now abandoned.

BACKGROUND OF THE INVENTION

1. Field of the Invention

This invention relates to a vertical power transistor device for use in an integrated circuit. More particularly, it relates to such a vertical power transistor device which has sufficient current and voltage capability to provide output power from an integrated circuit which includes low power transistors.

2. Description of the Prior Art

DMOS power transistors are known in the art, for example, as described in U.S. Pat. No. 4,345,265, issued Aug. 17, 1982 to Blanchard. Integrated circuits containing low voltage logic transistors and one or more high power DMOS transistors have been fabricated with a variety of techniques. Two of these techniques are known as self isolated and junction isolated DCMOS. These technologies both use CMOS transistors in the logic/control section of the integrated circuit, while the output transistor or transistors are DMOS. Both of these technologies have advantages for certain applications. However, the parallel sum of the output resistance of the power DMOS transistors is too large for many applications It would be advantageous to provide a power transistor structure which did not result in such a large output resistance.

SUMMARY OF THE INVENTION

Accordingly, it is an object of this invention to provide a power transistor structure suitable for use as an output transistor in an integrated circuit.

It is another object of the invention to provide such a power transistor structure having an increased power capacity which can be junction isolated when more than one high voltage switch is needed in an integrated circuit.

It is a further object of the invention to provide such a power transistor structure which will eliminate the need for an external output power transistor with integrated circuits.

The attainment of these and related objects may be achieved through use of the novel power transistor and integrated circuit structure herein disclosed. A power transistor structure in accordance with this invention is formed on a substrate of a first conductivity type. An epitaxial layer of a second conductivity type is on the substrate, forms a p-n junction therewith and has an upper surface. In a preferred form of the invention, a deep body and a body region contiguous to the deep body, both of the second conductivity type, extend from the upper surface into the epitaxial layer. A source region of the first conductivity type extends from the upper surface into the epitaxial layer, within and to a depth less than that of the body region in the preferred form of the invention, and forms a p-n junction with the body dopant and the dopant in the epitaxial layer. In the preferred form, a lateral distance between the body region and the source region from a common edge along the upper surface forms a channel region. A drain region of the first conductivity type is spaced from the source and body regions and extends from the upper surface through the epitaxial layer to the substrate, forming a p-n junction with the epitaxial layer. An insulating layer on the upper surface extends between the source region and the drain region. A conductive gate electrode on the insulating layer extends between the source region and the drain region A conductive electrode is electrically connected to the source and body regions. Another conductive electrode is electrically connected to the substrate, electrically to contact the drain region.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Figure 1:
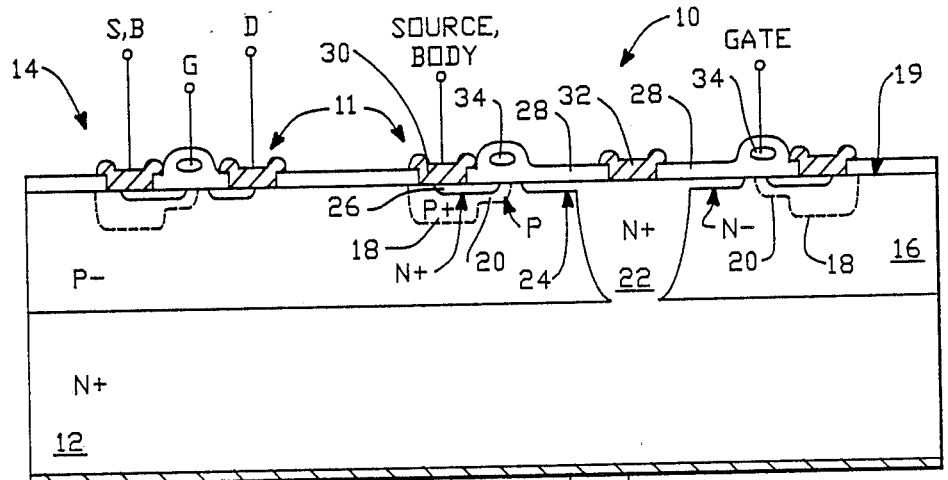
FIG. 1 is a cross-section view of a portion of an integrated circuit including a power transistor in accordance with the invention, showing a drain region separated from a body region.

Turning now to the drawings, more particularly to FIG. 1, there is shown a power transistor 10 in accordance with the invention. The power transistor 10 is formed as part of an integrated circuit 11 on a highly conductive n+ substrate 12 having a thickness of, for example, 400 micrometers and a resistivity of, for example, 0.020 ohm-centimeters. The integrated circuit 11 includes a plurality of low voltage logic/control devices 14, one of which is shown to the left of the power transistor 10. The low voltage logic/control devices 14 are fabricated as in conventional self isolated technology, and they therefore will not be described further. The integrated circuit 11 is fabricated in a lightly doped p— epitaxial layer 16 grown on the substrate 12. The epitaxial layer 16 has a thickness of from about 10 to about 100 micrometers and a resistivity of, for example, about 30 ohm-centimeters. A p+ diffusion 18 having a thickness of, for example, about 5 micrometers and a sheet resistance of, for example, about 100 ohms per square is formed in the epitaxial layer 18 extending from surface 19. The p+ diffusion 18 surrounds and is integral with an intermediate level doping p diffusion 20 also extending from surface 19 and having a thickness of, for example, about 3 micrometers and a sheet resistance of, for example, about 200 ohms per square. A deep n+ diffusion 22 extends from surface 19 completely through the epitaxial layer 16 to the n+ substrate 12. The n+ diffusion 22 has a sheet resistance of about 25 ohms per square. Surrounding the n+ diffusion 22 is a shallow n— diffusion 24 extending from the surface 19 about 1 micrometer and having a sheet resistance of about 3000 ohms per square. The n— diffusion 24 constitutes a drain diffusion of the device 10 which depletes when a high drain-to-source voltage is applied. The depleted n— diffusion distributes the voltage from drain-to-source so that the device breakdown is sufficiently high for the circuit application. The deep n+ diffusion 22 provides a low resistance path from the drain diffusion 24 to the n+ substrate 12. An n+ diffusion 26 extends from the surface 19 into the p+ diffusion 18 and p diffusion 20 to form a source diffusion of the device 10. The device 10 is completed by an insulating layer 28, conductive contacts 30 and 32 to the source and drain through the insulating layer 28 to the surface 19, a gate electrode 34 between the source and drain diffusions 24 and 26 and separated from the surface 19 by the insulating layer 28, and a backside conductive drain contact 36. The drain contact 32 is not necessary, but is often convenient, especially for testing purposes.

Figure 2:
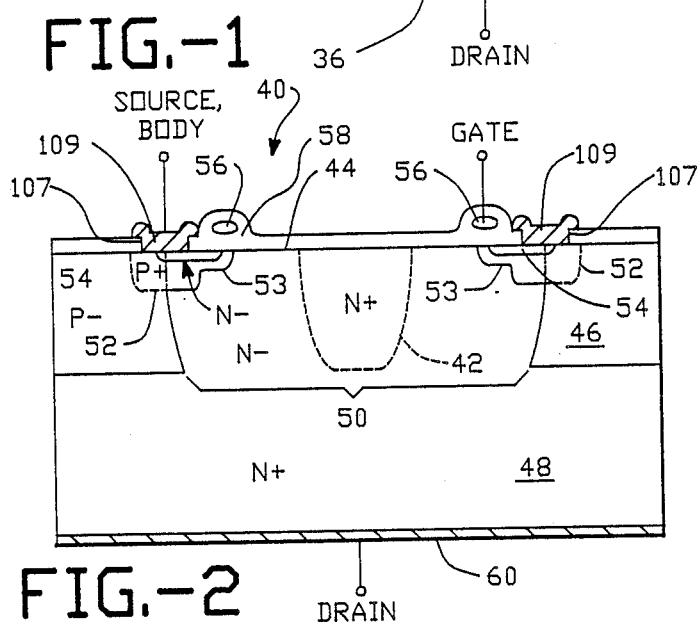
FIG. 2 is a cross-section view of another portion of an integrated circuit including another embodiment of a power transistor in accordance with the invention, showing use of a lightly doped but deep drain region that overlaps a channel region.

FIG. 2 shows another self-isolated DCMOS power transistor 40 in which an n+ sinker diffusion region 42 extends from surface 44 through p— epitaxial layer 46 to substrate 48 within a lightly doped n— region 50. The n+ region 42 has the same resistivity as the n+ region 22 in FIG. 1, and the n-region 50 has a sheet resistance of 500 to 5000 ohms per square. The n— region 50 may intersect p+ diffusion 52 as shown or the surrounding p diffusion 53, or may extend only part of the distance between n+ region 42 and p diffusion 53. Gate electrode 56 is spaced from surface 44 by oxide 58 and is positioned over the diffusion 52 between the source diffusion 54 and the diffusion 50 at the surface 44. A drain contact 60 is provided on the backside of the substrate 48. Other than as shown and described, the construction of the power transistor 40 is the same as that of the power transistor 10.

In operation, the devices 10 and 40 are normally OFF. To turn them on, a sufficient voltage, for example, +3 to about +7 volts, is applied to the gate electrodes 34 or 56 to invert the p region 20 or 53 near the surface 19 or 44 beneath the gate electrodes 34 or 56. The depth of such inversion increases with increasing gate voltage. The inversion creates a current flow path from the sources 26 or 54 through the inversions, the regions 24 and 22 or 50 and 42 and the substrate 12 or 48 to the drain electrode 36 or 60. In a typical example, the devices 10 and 40 will handle a forward current of up to about 10 amperes at a forward voltage applied to the drains 36 or 60 of from about +5 to about +50 volts, depending on the gate voltage. Because the n+ regions 22 or 42 provide a low resistance current path to the substrates 12 or 48, only one of the power transistors 10 or 40 can be fabricated on an integrated circuit to serve as a replacement for an external output power transistor conventionally employed with integrated circuits.

Figure 3:
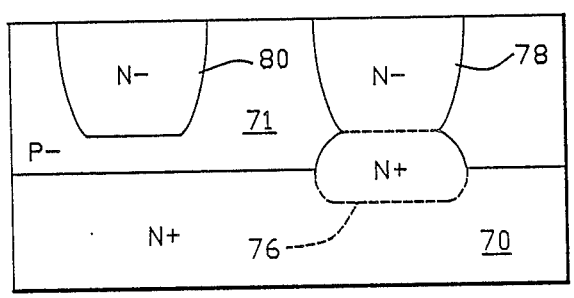
FIG. 3 is a cross-section view of a portion of an integrated circuit including a first method of forming a drain region through to the substrate in accordance with the invention.
Figure 4:
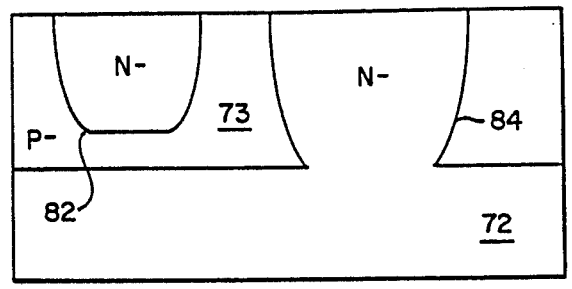
FIG. 4 is a cross-section view of a second portion of an integrated circuit including a second method of forming the drain region through to the substrate in accordance with the invention.
Figure 5:
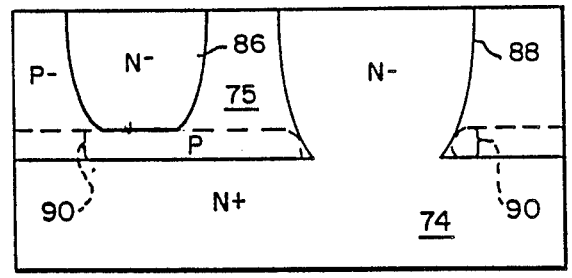
FIG. 5 is a cross-section view of a third portion of an integrated circuit including a third method of forming the drain region through to the substrate in accordance with the invention.
Figure 5A:
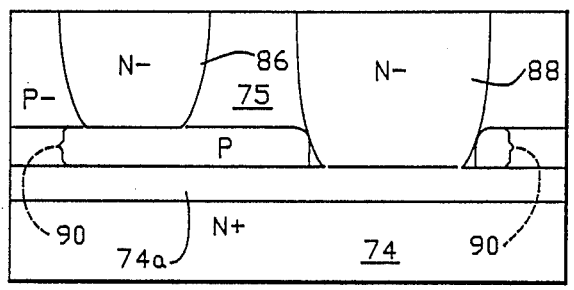
FIG. 5a is a cross-section view of a modified form of the structure shown in FIG. 5.

FIGS. 3-5 show methods of forming, the structures of the invention that will provide a low resistance current flow path to n+ substrates 70, 72 and 74 through epitaxial layers 71, 73 and 75, while avoiding such a current flow path at other parts of the circuit. In FIG. 3, a rapidly diffusing n+ buried layer 76 is provided beneath n— well 78, through which a low resistance path to the substrate 70 is desired. Phosphorus or any other rapidly diffusing n-type dopant is used for the buried layer 76. N— well 80 has the same configuration as the n— well 78, but can be used for other purposes because it lacks a buried layer beneath it. In FIG. 4, n— wells 82 and 84 of different depth are provided in the p— epitaxial layer 73. The well 84 extends through the epitaxial layer 73 to the substrate 72 and can therefore be used to form a low resistance path to the substrate 72. In FIG. 5, the n— wells 86 and 88 have the same configuration, but a p buried layer 90 is provided between the n+ substrate 74 and the p— epitaxial layer 75 except beneath the n— well 88. The well 88 thus reaches the substrate 74 while the well 86 is prevented from doing so. If breakdown problems are encountered with the structure shown in FIG. 5 between the p buried layer 90 and the n+ substrate, an epitaxially grown n type buffer layer 74a between the substrate 74 and the p layer 90 can be included, as shown in FIG. 5a. The n— wells 78, 84 and 88 are used to form completed power transistors in the same manner as the n— well 50 in FIG. 2.

Figure 6A:
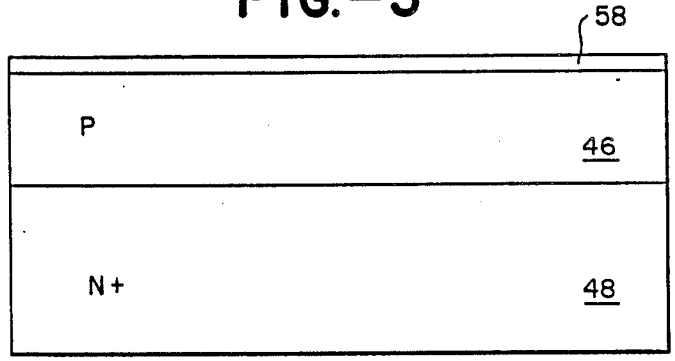
FIGS. 6a through 6f are sequential cross-section views of a portion of an integrated circuit during fabrication of a power transistor in accordance with the invention.
Figure 6B:
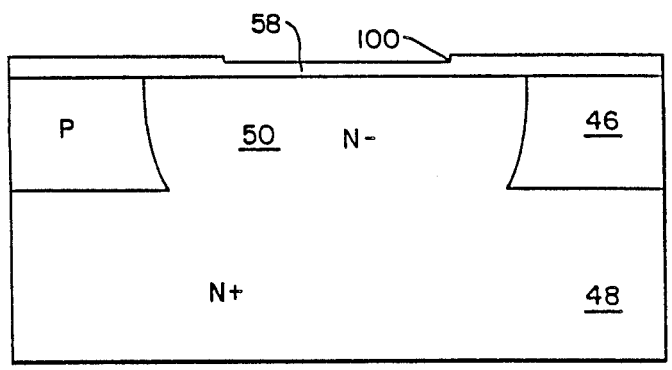
Figure 6C:
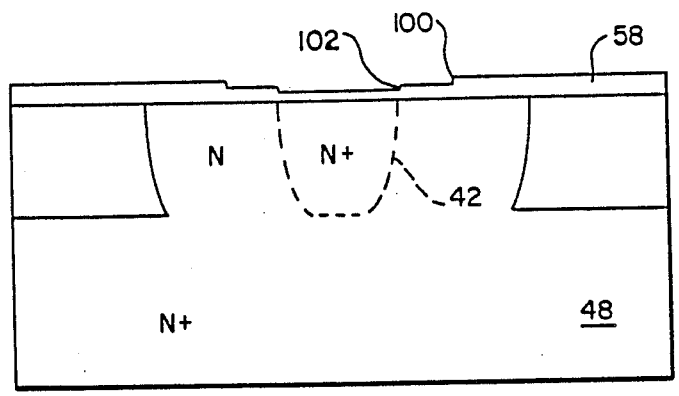
Figure 6D:
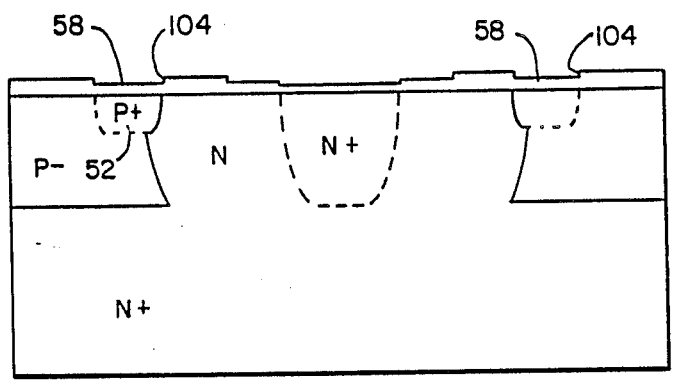
Figure 6E:
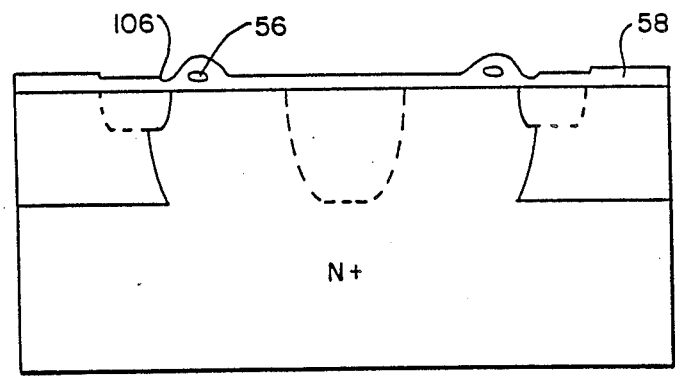
Figure 6F:
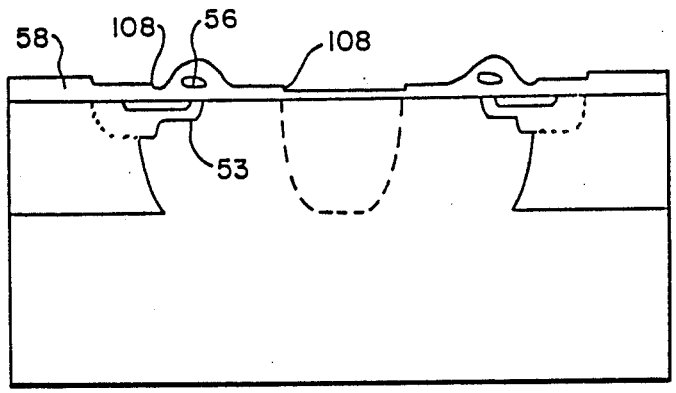

A typical process sequence for making the device 40 is shown in FIGS. 6a–6f. A p type epitaxial layer 46 is grown on an n+ substrate 48 and oxidized to form the oxide layer 58 (FIG. 6a). The top oxide 58 is masked and etched using conventional techniques to form opening 100 (FIG. 6b). An n type dopant is introduced and diffused through the p type epitaxial layer 46 to the n+ substrate 48 to form the lightly doped n— region 50. The oxide 58 is regrown in the opening 100. The oxide layer 58 is masked and etched to form a second opening 102 within the opening 100 (FIG. 6c). An n type dopant is introduced and diffused through the opening 102 to form the n+ region 42 extending through to the n+ substrate 48. The oxide layer 58 is regrown in the opening 102. The oxide layer 58 is masked and etched to form annular opening 104, and a p type dopant is introduced and diffused to form the deep p+ body 52 (FIG. 6d). The oxide layer 58 is regrown in the opening 104. The oxide layer 58 is masked and etched to form opening 106 and a gate oxide is regrown in the opening 106 (FIG. 6e). A layer of polycrystalline silicon is deposited over the oxide layer 58, doped, masked, etched and oxidized to form the gate electrode 56 and portion of the oxide layer 58 overlying the gate electrode 56. The oxide layer 58 is masked, and opening 108 is formed in the oxide layer 58 adjacent to the gate electrode 56 (FIG. 6f). A p type dopant is introduced through the opening 108 to form body region 53 and n type dopant is introduced through the same opening 108 to form the source region 54 and a channel region from the body region 53 between the source region 54 and the n— well 50. The channel region is formed by the sequential diffusion of the p type dopant and the n type dopant from the same edge. The oxide layer is then etched to form contact openings 107 (FIG. 2) through the oxide layer 58, metal is deposited on the oxide 58, masked and etched to form contacts 109 at the source/body and gate regions 53 and 54 on the top surface. Contact 60 to the back or drain surface is formed following passivation (not shown) of the device 40, giving the structure shown in FIG. 2.

Figure 7:
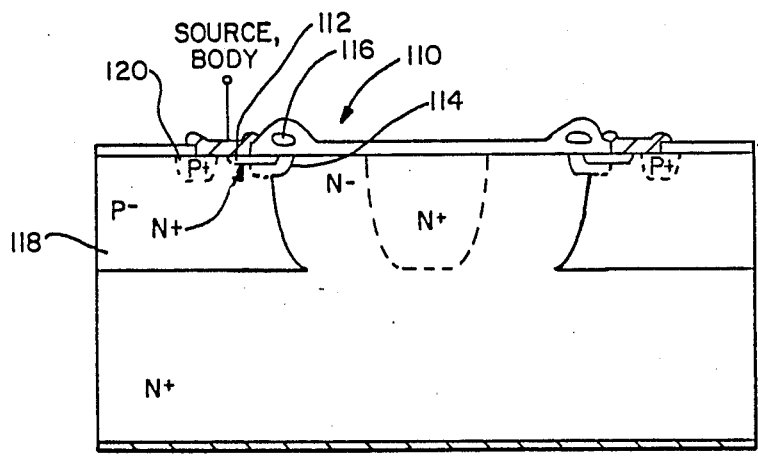
FIG. 7 is a cross-section view of a third embodiment of a power transistor in accordance with the invention.

FIG. 7 shows a portion of another self isolated DCMOS power transistor 110 of the invention in which n+ source region 112 is partly within p+ region 114 toward gate electrode 116. The source region 112 also extends into the p— epitaxial layer 118 away from the gate 116. P+ region 120 adjoins but is separated from the source region 112. This construction reduces capacitance while allowing the p+ region 114 to set the device threshold, thus obtaining the same benefit as in the FIGS. 1 and 2 embodiments with a lower device capacitance. Other than as shown and described, the construction, fabrication and operation of the FIG. 7 embodiment of the invention is the same as that of the FIG. 2 embodiment.

Figure 8:
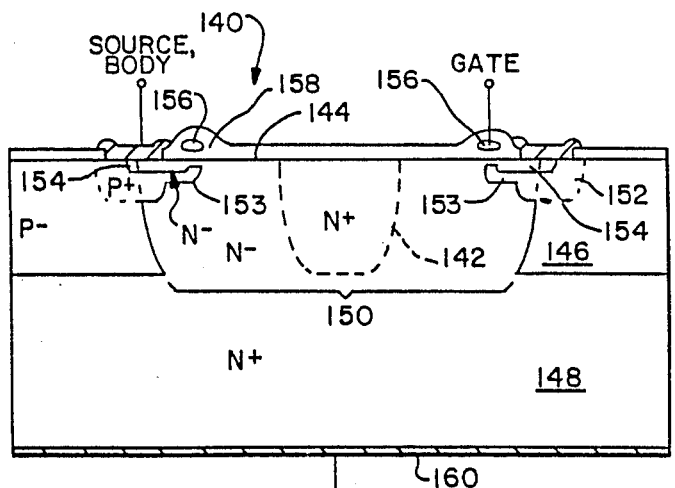
FIG. 8 is a cross-section view of a fourth embodiment of a power transistor in accordance with the invention.

The power DMOS devices 10, 40 and 110 of FIGS. 1, 2 and 7 are all enhancement mode devices. The present invention can also be implemented as a depletion mode power DMOS transistor 140, as shown in FIG. 8, using well known fabrication techniques. The transistor 140 has the same structure as the transistor 40 in FIG. 2 except that n—type source 154 also forms an n—type channel beneath gate electrode 156, thus connecting the source 154 with n—type material to n— region 150, giving a normally ON device. To turn the transistor 140 OFF, a suitable potential is applied to the gate 156 to invert the n— type channel. Since the remaining elements 142-153 and 158-160 are the same as the corresponding elements 42-53 and 58-60 in FIG. 2, they will not be described further.

Figures 9, 11:
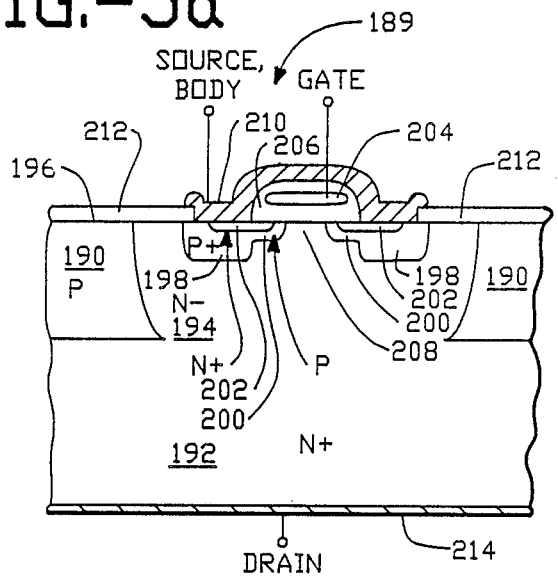
FIG. 9 is a cross-section view of a fifth embodiment of a power transistor in accordance with the invention.
FIG. 11 is a cross-section view of a seventh embodiment of a power transistor in accordance with the invention.

FIG. 9 shows a variation of the FIG. 7 device in which all of high voltage transistor 170 is inside of n—diffused region 172. Source 174-body 176 are at a potential different than that of substrate 178 (typically ground) to allow other circuit configurations, such as a current sense resistor between the source 174 and ground. A variation of this circuit puts a sense resistor in the leg of a "sense" portion of a current mirror power output device. In other respects, the construction and operation of the FIG. 9 embodiment is the same as that of the FIG. 7 embodiment, and it will therefore not be described further.

Figure 10:
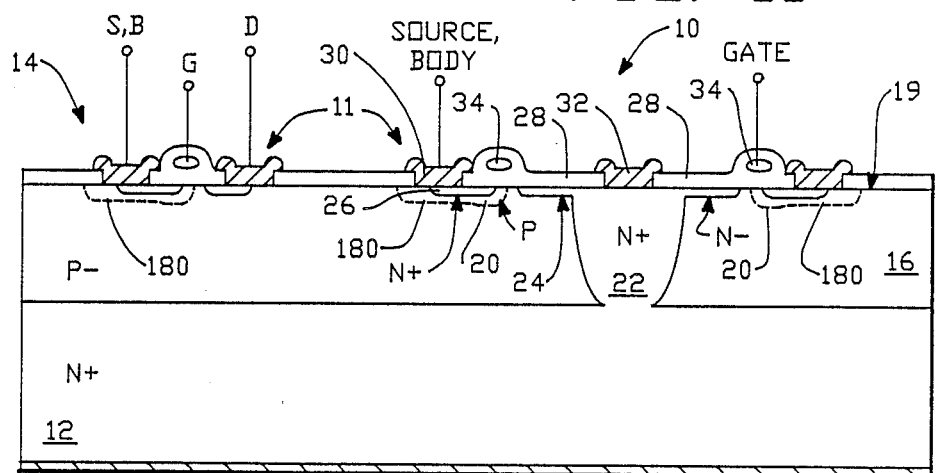
FIG. 10 is a cross-section view of a sixth embodiment of a power transistor in accordance with the invention.

In FIGS. 1-9, the p+ body is shown as having a deeper junction than its associated p type body. As shown in FIG. 10, the p+ diffusion 180 does not need to be deeper than the p type body 20. In other respects, the construction and operation of the FIG. 10 embodiment is the same as that of the FIG. 1 embodiment, and it will therefore not be described further.

Vertical DMOS devices may also be fabricated in accordance with this invention, as shown by the power transistor 189 in FIG. 11. A p— epitaxial layer 190 is grown on an n+ substrate 192 and an n— well 194 diffused from surface 196 through the epitaxial layer 190, all as in the FIG. 2 embodiment. An annular p+ region 198 surrounds and is integral with an intermediate doping level p region 200, both of which also extend from surface 196 into the n—well 194. An n+ region 202 extends from the surface 196 into the regions 198 and 200. A gate electrode 204 is embedded in gate oxide layer 206 and extends from over the n+ region 202 completely over portion 208 of the n— well 194 inside the region 200. A source, body contact 210 is ohmically connected to the regions 198 and 202 at surface 196. Oxide 212 extends over the rest of the surface 196. A drain contact 214 is provided on the backside of the substrate 192. The device 189 has a higher current capability and a lower on resistance than all of the devices described above, because the configuration of the regions 198 and 200 and the gate electrode 204 allows better vertical operation.

In the above description, the p regions 20 or 53 are inverted to an n—type conductivity in order to provide a majority carrier conduction path from the sources 26 or 54 to the drains 22,24 or 50,42. All of the conductivity types in the devices could be reversed, to give a p—channel device.

It should now be readily apparent to those skilled in the art that a novel power transistor and integrated circuit structure incorporating the power transistor capable of achieving the stated objects of the invention has been provided. The low resistance path in the power transistor obtained with this structure means that a single power transistor can be used in integrated circuits which previously required an external transistor because of the low voltage drop required.

It should further be apparent to those skilled in the art that various changes may be made in form and details of the invention as shown and described. For example, the source and body contacts of the devices can be brought out separately. It is intended that such changes be included within the spirit and scope of the claims appended hereto.

What is claimed is:

1. A power transistor device, which comprises a substrate of a first conductivity type, an epitaxial layer of a second conductivity type and a given resistivity on said substrate, forming a p—n junction therewith and having an upper surface, a source region of the first conductivity type extending from the upper surface into said epitaxial layer and being separated therefrom by a p—n junction, a vertical drain region of the first conductivity type spaced from said source region, having a portion with a higher dopant concentration than said epitaxial layer, extending from the upper surface through said epitaxial layer to said substrate and forming p—n junction with said epitaxial layer, an insulating layer on the upper surface extending between said source region and said vertical drain region, a conductive gate electrode on said insulating layer extending between said source region and said vertical drain region, a conductive electrode electrically connected to said source region, and a conductive electrode electrically connected to said substrate and, through said substrate, to said vertical drain region, said source region being separated from said vertical drain region by a region of the second conductivity type extending from the upper surface into said epitaxial layer a greater extent than said source region and having a portion between said source region and said vertical drain region, said source region being contained at least in part within said region of the second conductivity type and having a higher dopant concentration than a remainder of said epitaxial layer.

2. The power transistor device of claim 1 in which said source region is contained within said region of the second conductivity type and forms a p—n junction therewith.

3. The power transistor device of claim 1 in which said source region is partly within said region of the second conductivity type and extends partly from said region of the second conductivity type laterally away from said vertical drain region into said epitaxial layer and forms a p—n junction with both said region of the second conductivity type and said epitaxial layer.

4. A power transistor device, which comprises a substrate of a first conductivity type, an epitaxial layer of a second conductivity type on said substrate, forming a p—n junction therewith and having an upper surface, a source region of the first conductivity type extending from the upper surface into said epitaxial layer and being separated therefrom by a p—n junction, a drain region of the first conductivity type spaced from said source region, extending from the upper surface through said epitaxial layer to said substrate and forming a p—n junction with said epitaxial layer, an insulating layer on the upper surface extending between said source region and said drain region, a conductive electrode on said insulating layer extending between said source region and said drain region, a conductive electrode electrically connected to said source region, and a conductive electrode electrically connected to said substrate, said source region being separated from said drain region by a region of the second conductivity type extending from the upper surface into said epitaxial layer and having a higher dopant concentration than a remainder of said epitaxial layer, said source region being partly within said region of the second conductivity type and extending partly from said region of the second conductivity type into said epitaxial layer and forms a p-n junction with both said region of the second conductivity type and said epitaxial layer, said region of the second conductivity type being located in part in said epitaxial layer and in part in a region of the first conductivity type extending through the epitaxial layer between the upper surface and said substrate and surrounding said drain region.

5. A power transistor device, which comprises a substrate of a first conductivity type, an epitaxial layer of a second conductivity type on said substrate, forming a p-n junction therewith and having an upper surface, a source region of the first conductivity type extending from the upper surface into said epitaxial layer and being separated therefrom by a p—n junction, a drain region of the first conductivity type spaced from said source region, extending from the upper surface through said epitaxial layer to said substrate and forming a p-n junction with said epitaxial layer, an insulating layer on the upper surface extending between said source region and said drain region, a conductive gate electrode on said insulating layer extending between said source region and said drain region, a conductive electrode electrically connected to said source region, and a conductive electrode electrically connected to said substrate, said source region being separated from said drain region by a region of the second conductivity type extending from the upper surface into said epitaxial layer and having a higher dopant concentration than a remainder of said epitaxial layer, said drain region comprising a first region of the first conductivity type intersecting said region of the second conductivity type and a second region of the first conductivity type having a higher conductivity than said first region of the first conductivity type and laterally surrounded by said first region.

6. The power transistor device of claim 1 in which said region of the second conductivity type has a first portion surrounding a second portion, said first portion having a higher conductivity than said second portion.

7. The power transistor device of claim 6 in which said first portion extends from the upper surface a greater extent than said second portion.

8. The power transistor device of claim 7 in which said region of the second conductivity type is contained in a region of the first conductivity type extending through the epitaxial layer between the upper surface and said substrate and surrounding said vertical drain region.

9. The power transistor device of claim 5 in which said second portion extends from the upper surface a greater extent than said first portion.

10. A power transistor device, which comprises a substrate of a first conductivity type, an epitaxial layer of a second conductivity type on said substrate, forming a p—n junction therewith and having an upper surface, a source region of the first conductivity type extending from the upper surface into said epitaxial layer and being separated therefrom by a p—n junction, a drain region of the first conductivity type spaced from said source region, extending from the upper surface through said epitaxial layer to said substrate and forming a p—n junction with said epitaxial layer, an insulating layer on the upper surface extending between said source region and said drain region, a conductive gate electrode on said insulating layer extending between said source region and said drain region, a conductive electrode electrically connected to said source region, and a conductive electrode electrically connected to said substrate, said source region being separated from said drain region by a region of the second conductivity type extending from the upper surface into said epitaxial layer and having a higher dopant concentration than a remainder of said epitaxial layer, said region of the second conductivity type having a first portion surrounding a second portion, said first portion having a higher conductivity than said second portion, said first portion extending from the upper surface a greater extent than said second portion, said region of the second conductivity type being contained in part in said epitaxial layer and in part in a region of the first conductivity type extending through the epitaxial layer between the upper surface and said substrate and surrounding said drain region.

11. A power transistor device, which comprises a substrate of a first conductivity type, an epitaxial layer of a second conductivity type on said substrate, forming a p—n junction therewith and having an upper surface, a source region of the first conductivity type extending from the upper surface into said epitaxial layer and being separated therefrom by a p—n junction, a drain region of the first conductivity type spaced from said source region, extending from the upper surface through said epitaxial layer to said substrate and forming a p—n junction with said epitaxial layer, an insulating layer on the upper surface extending between said source region and said drain region, a conductive gate electrode on said insulating layer extending between said source region and said drain region, a conductive electrode electrically connected to said source region, and a conductive electrode electrically connected to said substrate, said source region connecting to said drain region at the upper surface of said epitaxial layer by means of first conductivity type material, and said source region being in part contained in second conductivity type material.

12. The power transistor device of claim 11 in which said source region is in part contained in a region of the second conductivity type material having a higher conductivity than said epitaxial layer.

13. The power transistor device of claim 12 in which said region of the second conductivity type is contained in part in said epitaxial layer and in part in a region of the first conductivity type extending through the epitaxial layer between the upper surface and said substrate and surrounding said drain region.

14. An integrated circuit comprising the power transistor of claim 1 self-isolated by at least said vertical drain and said substrate forming reversed biased p—n junctions with said layer of the second conductivity type from at least one additional transistor formed on a common substrate.

15. A power transistor device, which comprises a substrate of a first conductivity type, an epitaxial layer of a second conductivity type and a given resistivity on said substrate, forming a p—n junction therewith and having an upper surface, a source region of the first conductivity type extending from the upper surface into said epitaxial layer and being separated therefrom by a p—n junction, a vertical drain region of the first conductivity type spaced from said source region, having a portion with a higher dopant concentration than said epitaxial layer, extending from the upper surface through said epitaxial layer to said substrate and forming a p—n junction with said epitaxial layer, a channel region of said first conductivity type extending into said epitaxial layer form said upper surface between and connecting said source region and said vertical drain region, an insulating layer on the upper surface over said channel region and extending between said source region and said vertical drain region, a conductive gate electrode over said channel region on said insulating layer extending between said source region and said vertical drain region, a conductive electrode electrically connected to said source region, and a conductive electrode electrically connected to said substrate and, through said substrate, to said vertical drain, said source region being separated from a remainder of said epitaxial layer by a region of the second conductivity type extending from the upper surface into said epitaxial layer and having a higher dopant concentration than a remainder of said epitaxial layer, said source region being located within said region of the second conductivity type and forming a p—n junction therewith, other than at said channel region.

16. A power transistor device, which comprises a substrate of a first conductivity type, an epitaxial layer of a second conductivity type on said substrate, forming a p-n junction therewith and having an upper surface, a source region of the first conductivity type extending from the upper surface into said epitaxial layer and being separated therefrom by a p—n junction, a drain region of the first conductivity type spaced from said source region, extending from the upper surface through said epitaxial layer to said substrate and forming a p—n junction with said epitaxial layer, a channel region of said first conductivity type extending into said epitaxial layer from said upper surface between and connecting said source region and said drain region, an insulating layer on the upper surface over said channel region and extending between said source region and said drain region, a conductive gate electrode over said channel region on said insulating layer extending between said source region and said drain region, a conductive electrode electrically connected to said source region, and a conductive electrode electrically connected to said substrate, said source region being separated from a remainder of said epitaxial layer by a region of the second conductivity type extending from the upper surface into said epitaxial layer and having a higher dopant concentration than a remainder of said epitaxial layer, said source region being located within said region of the second conductivity type and forming a p—n junction therewith, said drain region comprising a first region of the first conductivity type intersecting said region of the second conductivity type and a second region of the first conductivity type having a higher conductivity than said first region of the first conductivity type and laterally surrounded by said first region.

17. A power transistor device, which comprises a substrate of a first conductivity type, an epitaxial layer of a second conductivity type and a given resistivity on said substrate, forming a p—n junction therewith and having an upper surface, a vertical region of the first conductivity type having a portion with a higher dopant concentration than said epitaxial layer, extending through the epitaxial layer between the upper surface and said substrate, a region of the second conductivity type extending from the upper surface into said vertical region of the first conductivity type and having a higher dopant concentration than said epitaxial layer, a source region of the first conductivity type extending from the upper surface into said region of the second conductivity type and being separated therefrom by a p—n junction, an insulating layer on the upper surface extending between said source region and said vertical region of the first conductivity type, a conductive gate electrode on said insulating layer extending between said source region and said vertical region of the first conductivity type, a conductive electrode electrically connected to said source region, a conductive electrode electrically connected to said substrate and, through said substrate, to said vertical region of the first conductivity type, and a vertical drain region of the first conductivity type spaced from conductive electrode electrically connected to said source region, and a conductive electrode electrically connected to said substrate and, through said substrate, to said vertical drain, said source region being separated from a remainder of said epitaxial layer by a region of the second conductivity type extending from the upper surface into said epitaxial layer and having a higher dopant concentration than a remainder of said epitaxial layer, said source region being located within said region of the second conductivity type and forming a p—n junction therewith, other than at said channel region.

18. A power transistor device, which comprises a substrate of a first conductivity type, an epitaxial layer of a second conductivity type and a given resistivity on said substrate, forming a p—n junction therewith and having an upper surface, a vertical region of the first conductivity type having a portion with a higher dopant concentration than said epitaxial layer, extending through the epitaxial layer between the upper surface and said substrate, a region of the second conductivity type extending from the upper surface into said vertical region of the first conductivity type and having a higher dopant concentration than said epitaxial layer, a source region of the first conductivity type extending from the upper surface into said region of the second conductivity type and being separated therefrom by a p—n junction, an insulating layer on the upper surface extending between said source region and said vertical region of the first conductivity type, a conductive gate electrode on said insulating layer extending between said source region and said vertical region of the first conductivity type, a conductive electrode electrically connected to said source region, a conductive electrode electrically connected to said substrate and, through said substrate, to said vertical region of the first conductivity type, said region of the second conductivity type and said source region being annular in shape and said conductive gate electrode extending between opposing parts of said annular region of the second conductive type and said annular source region.

19. A power transistor device, which comprises a substrate of a first conductivity type, an epitaxial layer of a second conductivity type and a given resistivity on said substrate, forming a p—n junction therewith and having an upper surface, a vertical region of the first conductivity type having a portion with a higher dopant concentration than said epitaxial layer, extending through the epitaxial layer between the upper surface and said substrate, a region of the second conductivity type extending from the upper surface into said vertical region of the first conductivity type and having a higher dopant concentration than said epitaxial layer, a source region of the first conductivity type extending from the upper surface into said region of the second conductivity type and being separated therefrom by a p—n junction, an insulating layer on the upper surface extending between said source region and said vertical region of the first conductivity type, a conductive gate electrode on said insulating layer extending between said source region and said vertical region of the first conductivity type, a conductive electrode electrically connected to said source region, a conductive electrode electrically connected to said substrate and, through said substrate, to said vertical region of the first conductivity type, said region of the second conductivity type having a first portion surrounding a second portion, said first portion having a higher conductivity than said second portion.

20. The power transistor device of claim 19 in which said first portion extends from the upper surface a greater extent than said second portion.

* * * * *